United States Patent
Park et al.

(10) Patent No.: US 6,920,602 B1
(45) Date of Patent: Jul. 19, 2005

(54) TURBO ENCODING/DECODING DEVICE AND METHOD FOR PROCESSING FRAME DATA ACCORDING TO QOS

(75) Inventors: Chang-Soo Park, Seoul (KR); Joong-Ho Jeong, Seoul (KR); Hyeon-Woo Lee, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/282,851

(22) Filed: Mar. 31, 1999

(30) Foreign Application Priority Data

Mar. 31, 1998 (KR) .......................................... 98-11380

(51) Int. Cl.[7] .......................................... H03M 13/03
(52) U.S. Cl. ...................... 714/788; 714/762; 370/470; 370/472; 341/51; 341/94; 341/95
(58) Field of Search ................. 714/794–796, 714/712, 752, 701, 774, 755, 786, 788, 790, 758, 753, 792; 370/337, 394, 333, 349, 368, 347, 252, 441, 342, 316, 331, 468, 442, 470, 472–476; 375/341; 341/50, 94, 95, 51, 43; 382/251, 239; 455/436, 442

(56) References Cited

U.S. PATENT DOCUMENTS

| | | | | |
|---|---|---|---|---|
| 5,212,684 A | * | 5/1993 | MacNamee et al. | 370/280 |
| 5,307,351 A | * | 4/1994 | Webster | 370/470 |
| 5,430,774 A | | 7/1995 | Dupuy | |
| 5,442,646 A | * | 8/1995 | Chadwick et al. | 375/296 |
| 5,446,747 A | | 8/1995 | Berrou | |
| 5,936,972 A | * | 8/1999 | Meidan et al. | 370/333 |
| 5,943,371 A | * | 8/1999 | Beale et al. | 375/341 |
| 5,991,454 A | * | 11/1999 | Fowler | 382/239 |
| 6,088,387 A | * | 7/2000 | Gelblum et al. | 375/222 |
| 6,289,486 B1 | * | 9/2001 | Lee et al. | 714/701 |
| 6,370,669 B1 | * | 4/2002 | Eroz et al. | 714/774 |

FOREIGN PATENT DOCUMENTS

| | | | | |
|---|---|---|---|---|
| EP | 0 528 370 A2 | 8/1992 | | H04L/12/56 |
| EP | 0 652 680 | 11/1994 | | |
| JP | 06-043451 | 3/1994 | .......... | H03M/13/22 |
| JP | 6-350575 | 12/1994 | | |
| JP | 7-254862 | 10/1995 | | |
| JP | 8-237146 | 9/1996 | | |
| JP | 09-063964 | 3/1997 | ............. | H04L/1/00 |
| JP | 9-298526 | 11/1997 | | |
| WO | WO 97/40582 | 10/1997 | | |

OTHER PUBLICATIONS

Cardona et al. (An algebraic model for computing the maximum throughput of pipelined protocol processors; IEEE, pp.: 1827–1833, Nov. 29–Dec. 2, 1993).*

Tzou (An intrafield DCT–based HDTV coding for ATM networks; IEEE, pp.: 184–186, Jun. 1991).*

Shinji (Japan Patent Document No. 6–35057; Dec. 22, 1994).*

Migaku (Japan Patent Document No. 8–237146; Sep. 13, 1996.*

Koorapaty H et al.; "Performance of Turbo Codes with Short Frame Sizes"; Vehicular Technology Conference, 1997, IEEE 47th Phoenix, AZ, USA May 4–7, 1997, New York, NY USA IEEE, US, May 4, 1997, pp. 329–333.

"Digital Cellular Telecommunications System (Phase 2+); Channel coding (GSM 05.03 version 5.3.1)", ETS 300 909, XX, XX, Aug. 1997, pp. 1–38.

European Search Report dated Jul. 4, 2003, issued in a counterpart application, namely EP 03 00 7405.

* cited by examiner

Primary Examiner—Guy J. Lamarre
(74) Attorney, Agent, or Firm—Dilworth & Barrese LLP

(57) ABSTRACT

A turbo channel encoding/decoding device for a CDMA communication system. The device segments an input frame into multiple sub frames of an appropriate length when the input data frame is very long, and then encodes and decodes the sub frames. Otherwise, when the input data frames are very short, the device composes input frames into one super frame of an appropriate length and then encodes and decodes the super frame. After frame encoding/decoding, the frames are recomposed into the original input frames.

26 Claims, 6 Drawing Sheets

TURBO ENCODING/DECODING DEVICE AND METHOD FOR PROCESSING FRAME DATA ACCORDING TO QOS

CLAIM OF PRIORITY

This application makes reference to, incorporates the same herein, and claims all benefits accruing under 35 U.S.C. §119 from an application entitled TURBO CHANNEL ENCODING/DECODING DEVICE AND METHOD FOR PROCESSING FRAME ACCORDING TO QoS earlier filed in the Korean Industrial Property Office on 31 Mar. 1998, and there duly assigned Serial No. 9811380.

BACKGROUND OF THE INVENTION

1. Field of the Invention

The present invention relates generally to a device and method for encoding/decoding channel data in a mobile communication system, and in particular, to a device and method for encoding/decoding channel data using a turbo code.

2. Description of the Related Art

An encoder using a turbo code (hereinafter referred to as a turbo encoder) encodes an N-bit input frame into parity symbols using two simple parallel concatenated codes, wherein an RSC (Recursive Systematic Convolutional) code is generally used as a component code.

FIGS. 1 and 2 illustrate structures of conventional parallel turbo encoder and decoder, which are disclosed in U.S. Pat. No. 5,446,747 by Berrou, incorporated herein by reference.

FIG. 1 is a block diagram showing a configuration of a conventional turbo encoder. The turbo encoder of FIG. 1 includes a first constituent encoder 12, a second constituent encoder 14 and an interleaver 16 interconnected therebetween. For the first and second constituent encoders 12 and 14, an RSC encoder can be used, which is well known in the art. The interleaver 16 has the same size as a frame length of the input data (i.e., N bits), and decreases the correlation of the input data bitstream $d_k$ provided to the second constituent encoder 14. Therefore, the parallel concatenated codes for the input data bitstream, $d_k$, become $X_k$ (i.e., $d_k$ without modification) and $y_{1k}$, and $y_{2k}$ the outputs of the first 12 and second 14 constituent encoders.

FIG. 2 is a block diagram showing a configuration of a conventional burbo decoder. The turbo decoder includes an adder 18, subtracters 20 and 22, a soft decision circuit 24, delays 26, 28 and 30, and MAP (Maximum A Posterior Probability) decoders 32 and 34. The turbo decoder further includes an interleaver 36 which is identical to the interleaver 16 of FIG. 1, and deinterleavers 38 and 40. The turbo decoder repeatedly decodes data received by the frame unit using a MAP decoding algorithm, thereby decreasing a bit error rate (BER).

The utilization of interleaver 16 of the turbo encoder of FIG. 1 implies that encoding and decoding should be performed as a frame unit. Accordingly, it can be appreciated that the required memory and calculations required for the MAP decoders 32 and 34, shown in FIG. 2 are proportional to a value obtained by multiplying the frame size by a number of states of the first and second constituent encoders 12 and 14 of FIG. 1.

In a mobile communication system, voice and data are transmitted at a data rate of several Kbps to several Mbps, and a frame length of data input to a channel encoder may vary from several ms (milliseconds) to several hundred ms. For example, in the case where the data is transmitted at a data rate of over 32 Kbps. The number of data input to the turbo encoder is larger due to the high data rate, the turbo decoder requires more memory and calculations to decode the received data. The turbo encoder shows a property that an error correction performance is enhanced as the frame length of the input data becomes longer, however increasing the memory and calculations required in a decoder.

In addition, if the length of the input frame is too short, e.g., less than 8 kbps/10 ms, the interleaver 16 in the turbo encoder cannot sufficiently decrease the correlation among the input data, thereby deteriorating the error correction performance. That is, when the frame length of the input data is longer (or the input data rate is high), the turbo encoder structured as shown in FIG. 1 and the turbo decoder structured as shown in FIG. 2 require a lot of calculations and memory to perform encoding and decoding. Otherwise, when the frame length of the input data is shorter, the turbo encoder may exhibit lower performance results, as compared with a convolutional encoder or a concatenated encoder, thereby increasing the BER.

Accordingly, it is possible to decrease the required calculations and memory capacity required for decoding by appropriately varying the processing size of the data input to the turbo encoder, independent of the data rate for the corresponding service, while fully securing the low BER required in the communication system.

According to the present invention, as embodied and broadly described herein, a channel encoding/decoding apparatus is provided including a first constituent encoder for encoding data bits of a super frame or plurality of sub frames, an interleaver for interleaving the data bits of the super frame or sub frames, and a second constituent encoder for encoding the interleaved data bits of the super frame or sub frames. The second constituent encoder is coupled to the output of the interleaver.

The channel encoding/decoding apparatus can be used as part of a base station or mobile station. The novel turbo encoder would be included as part of a channel transmitter in accordance with an exemplary embodiment. The turbo encoder makes a determination as to whether to segment one input frame into several sub frames or continue several input frames into one super frame.

SUMMARY OF THE INVENTION

It is, therefore, an object of the present invention to provide a channel encoding device and method for variably encoding input data frames to sub or super frames of appropriate length according to a QoS (quality of service) of data to transmit.

It is another object of the present invention to provide a channel decoding device and method for decoding encoded frame data whose frame length is appropriately varied according to the QoS (quality of service) of data to transmit.

It is still another object of the present invention to provide a turbo channel encoding/decoding device and method for disassembling a long input frame or high data rate into multiple sub frames to be encoded, and for separately decoding the divided encoded sub frames and then reassembling the decoded sub frames into the original frame length.

It is further still another object of the present invention to provide a turbo channel encoding/decoding device and method for assembling short input frames or low data rate into a super frame having an appropriate length to encode the assembled super frame, decoding the assembled encoded super frame and then reassembling the decoded super frame into the original frames.

It is further still another object of the present invention to provide a turbo channel encoding/decoding device and method for determining an optimal length of the sub/super frames by analyzing a quality of service (QoS) such as frame length, time delay tolerance, error tolerance, receiver complexity (especially receiver memory), a data rate correspondence to a service type of input frame data to be transmitted, and disassembling or assembling an input data frame into sub or super frames according to the determination.

BRIEF DESCRIPTION OF THE DRAWINGS

The above and other objects, features and advantages of the present invention will become more apparent from the following detailed description when taken in conjunction with the accompanying drawings in which like reference numerals indicate like parts. In the drawings.

DETAILED DESCRIPTION OF THE PREFERRED EMBODIMENT

Figure 1:
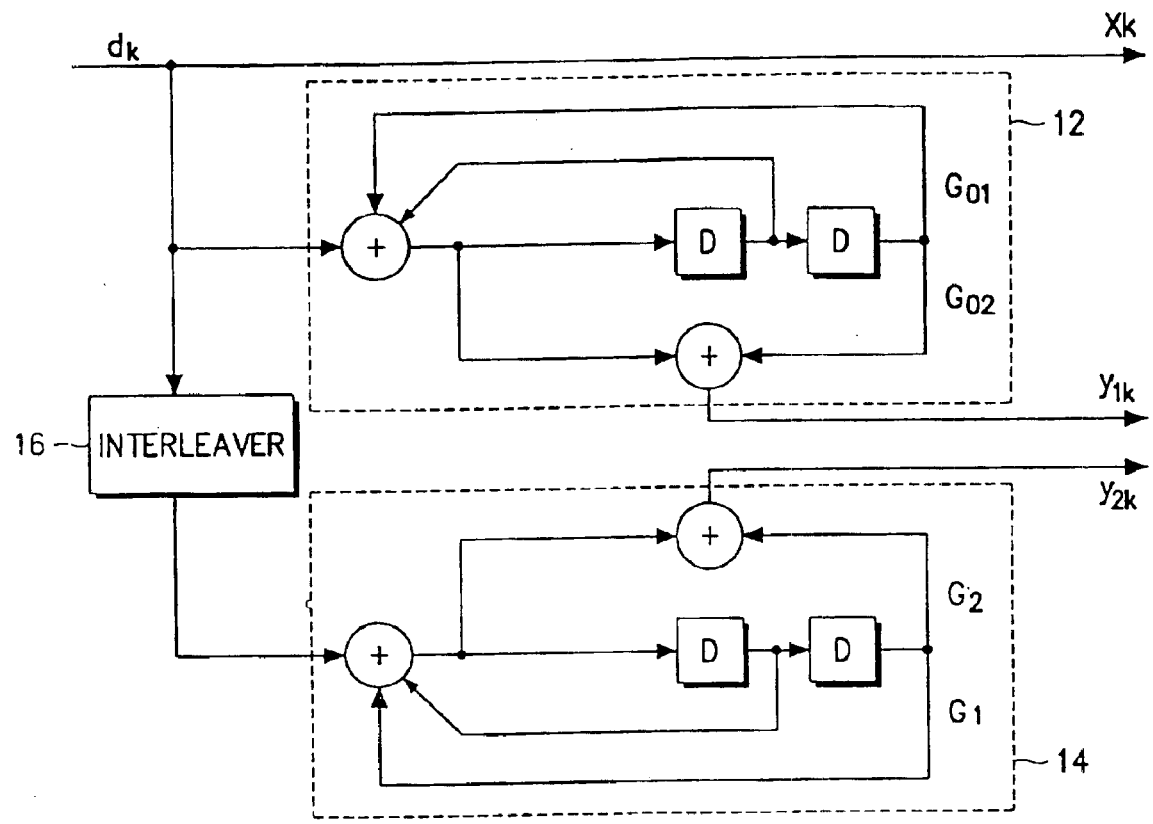
FIG. 1 is a diagram illustrating a block diagram of a conventional turbo encoder.

A preferred embodiment of the present invention will be described hereinbelow with reference to the accompanying drawings. In the following description, well known functions or constructions are not described in detail since they would obscure the invention in unnecessary detail.

Communication systems of the future will have capabilities for providing a plurality of services with varying QoS (Quality of Service) characteristics, and QoS parameters including a time delay, BER, and frame error rate (FER). Services may be generally divided into high error rate services and low error rate services. Those services which can be provided with a high error rate include: voice service which requires a relatively short time delay, and a short message service (SMS) which permits a long time delay. On the other hand, services requiring a low error rate include: a video conference service requiring a short time delay, and a still image or Internet file transfer service allowing a relatively longer time delay. Further, the same service may have different time delays and data rates.

For example, in the image service for transmitting and receiving moving picture information, a data rate is 32–2048 Kbps and a permissible time delay is in the range of 10–400 ms: the data rate and the permissible time delay can be, however, varied according to a number of criteria including: a class of the user or terminal using the service, a class of the base station providing the service or a channel condition during the corresponding service. In a CDMA mobile communication system in particular, since the output power of a base station or a mobile station is limited, it is inadequate to increase a transmission power of only a certain user for a high quality service. This is because when the transmission power of the specific user is increased, interference to other users will increase in proportion to the increased transmission power. Therefore, there is a demand for a method capable of providing various multimedia services with reduced interference to the other users by minimizing an increase in the transmission power.

In another example, a short packet data transmission service requires a low data rate and a very low error rate. However, if the time delay is out of the question, it is reasonable to decrease the error rate even though the time delay is somewhat increased.

In the meantime, the turbo encoder for forward error correction, shows a property that the bit error rate (BER) or the frame error rate (FER) are varied according to the data size of frame (i.e., the number of data bits to be processed in a prescribed time) determined by length of the input data frame and data rate. The turbo encoder consists of constituent encoders having a short constraint length, however, the error correction capability is improved as the correlation between the data input to the respective constituent encoders is decreased, due to the existence of the interleaver in the turbo encoder. The correlation between the data input to the respective constituent encoders becomes lower, as the data size of frame input to the turbo encoder becomes much more. Therefore, an increase in the frame length of the input data improves the error correction capability. However, an increase in length of the input frame causes an increase in the time delay at the encoder and the decoder.

Figure 3:
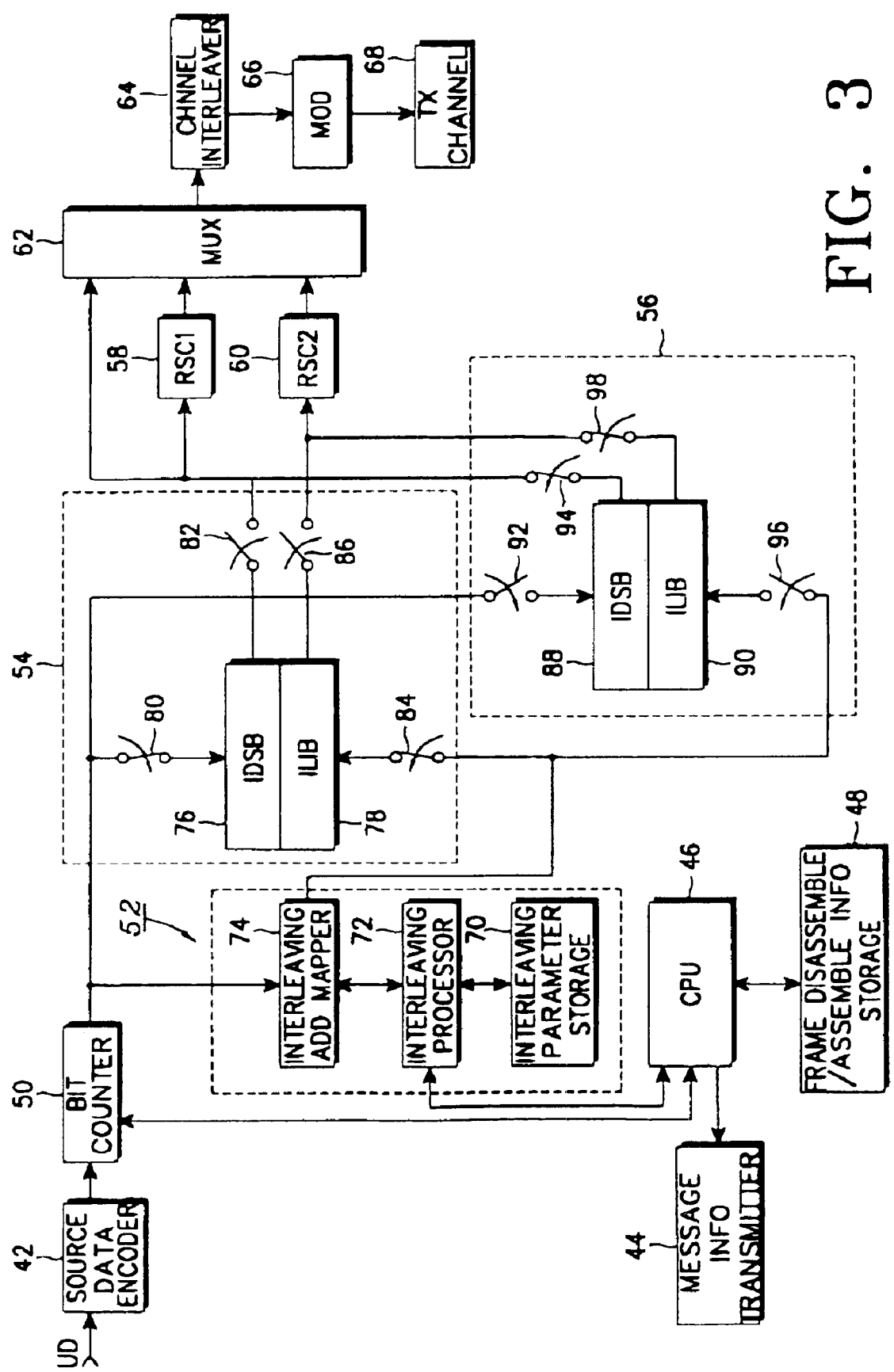
FIG. 3 is a diagram illustrating a block diagram of a channel transmitter including a turbo encoder according to an embodiment of the present invention.

FIG. 3 illustrates a configuration of a channel transmitter including a turbo encoder according to an embodiment of the present invention. The turbo encoder shown in FIG. 3 disassembles one input frame into several sub frames or assembles several input frames into one super frame by counting bits of the input user data in accordance with provided message information, and thereafter encodes the disassembled or assembled frames with a turbo code to transmit the encoded frames via a transmission channel. The term "message information" as used herein refers to information about the QoS, i.e., service type, rate of data such as voice, character, image and moving picture data, size of the input data frame, permissible delay, and permissible error. The message information is exchanged between a base station and a mobile station during a call setup and the exchange of the message information is continued till termination of the corresponding service. Further, predetermined information between the base station and the mobile station predetermined during the call setup can also be varied during the corresponding service by data exchanging. That is, the message information including information representing the size of the frame to be processed in the turbo encoder can be reset according to a rate of the data to be serviced. For example, when 10 ms frame data is serviced at a data rate of 2048 Kbps, one data frame consists of 20480 bits. In this case, the turbo encoder according to the present invention segments (or divides) the 10 ms frame into 10/4 ms subframes and then, turbo encodes four 5120-bit subframe and then recombining four encoded sub frame into 10 ms frame for channel interleaving. The turbo decoder then decodes the four encoded subframes and recomposes them into one 20480-bit 10 ms frame.

FIG. 3 is a block diagram of a channel transmitter including a turbo encoder according to an exemplary embodiment of the present invention.

As shown in FIG. 3, user data (UD) is received by a source data encoder 42. The user data UD has a data rate of over several tens of Kbps, such as character, image and moving picture data, as distinguished from voice data having a much lower data rate on the order of several Kbps. The source data encoder 42 encodes the received user data UD by the fixed length frame whose length is determined in accordance with the service type and then provides the encoded fixed length frame data to an input of a bit counter 50. For example, the source data encoder 42 typically encodes voice data with a 10 ms frame format, character data with a 20 ms frame format, image data with an 80 ms frame format, and moving picture data with a 40 ms frame format, and provides the respective encoded data into the bit counter 50. The processing size can be different with respect to data rate or frame length. The frame length unit can be fixed 10 ms or fixed 20 ms. A central processing unit (CPU) 46 transfers information about the QoS, i.e., service type of the user data to be transmitted (e.g., voice, character, image or moving picture) and the data rate to a message information receiver 108 of FIG. 6 via a message information transmitter 44. The channel transmission device of FIG. 3 can be equally applied to both the base station and the mobile station.

Although the present invention is described with reference to an embodiment which transmits the message information to the decoder using a separate transmitter, it is also possible to transmit the data size information by loading it in a head area of a transmission frame during data transmission.

Referring to FIG. 3, the CPU 46 reads, from a frame disassemble/assemble information storage unit 48, QoS information including information about service type of data to be transmitted, corresponding data rate, permissible delay, permissible error rate (BER or FER) and frame length, and information about service class of the base station or the mobile station. Next, the CPU 46 makes a determination to disassemble the received frame and therefore must also determine the size and number of the disassembled frames, using the read information. Alternatively, when constructing a super frame, the CPU 46 may determine to assemble the required frames and therefore must also determine the number of frames to be assembled, using the read information. Based on the determination, the CPU 46 provides a frame disassemble/assemble control signal and an interleaving mode signal to the bit counter 50 and a programmable interleaver 52, respectively, to perform turbo encoding. That is, according to the QoS of the data to transmit, the CPU 46 determines how many consecutive input frames should be assembled to generate a super frame, or alternatively determines the number of sub frames which will be generated by disassembling one input frame. The turbo encoder then turbo encodes data bits of the super frame or data bits of the respective sub frames. As previously stated, the QoS may include input frame length, user data rate, permissible delay, permissible error rate, etc.

In determining whether to disassemble or assemble the frames by the CPU 46, the following criteria are considered.

In general, for transmitting packet data, the mobile communication system uses a low data rate of below several tens of Kbps, with a transmission delay from several tens ms (milliseconds) and requires a BER on the order of $10^{-2}$–$10^{-4}$. For example, if the output frame of the source data encoder 42 is 10 ms long and a permissible delay time permitted in the turbo encoder is 40 ms, it is possible to combine four 10 ms frames output from the source data encoder 42 into one super frame, which will be input to the turbo encoder. Therefore, the error rate of to assembled packet data can be decreased.

For transmitting character, image and moving picture data, the mobile communication system has a permissible transmission delay from several tens ms to several hundreds ms and requires a BER of $10^{-6}$–$10^{-7}$. The performance of the turbo encoder is enhanced as the frame length of the input data is increased. However, additional calculations and memory is required in the turbo decoder. There is a trade-off between performance and decoder complexity. In the case of the packet data service, for example, it is possible to satisfy both the required BER and moderate decoder complexity by enabling the CPU 46 to generate a sub/super frame control signal for segmenting/combining the output data from the source data encoder 42, of M-bit length, into sub/super frames of N-bit length.

That is, the frame disassemble/assemble information storage unit 48 stores frame disassemble/assemble information for increasing the length N of the sub/super frame for a service requiring the low BER and for decreasing the length N of the sub/super frame for a service requiring a short time delay and a high BER. The CPU 46 reads the frame disassemble/assemble information from the frame disassemble/assemble information storage 48 according to the service type and the frame length of the input data.

Disassembling/assembling the frames input to the turbo encoder can be more readily appreciated from the following example. Assume a frame size of the data input to the turbo encoder is 20480 bits/10 ms, for a low BER service having a data rate 2048 Kbps. In the mobile station providing the above service, the turbo decoder requires a memory capacity which is proportional to 20480 bits multiplied by number of soft decision bits. An increase in the memory capacity of the mobile station causes an increase in complexity and cost of the mobile station.

However, in the service having a data rate of 2048 Kbps/10 ms, if the channel encoder divides (i.e., segments) a frame input to the turbo encoder into four sub frames (i.e., 10 ms/4) and encodes the sub frames, and a turbo decoder in the channel decoder then decodes the sub frames and recomposes the decoded sub frames into the original frame, the turbo decoder requires a memory capacity which is proportional to 5120 bits by the number of soft decision bits, thereby causing a reduction in the required memory capacity.

Furthermore, for a low BER service having a low data rate of 32 Kbps/10 ms, each data frame input to the turbo encoder will consist of 320 bits. If encoding is performed at a data rate of 32 Kbps/80 ms (i.e., each frame consists of 2560 bits), the time delay is somewhat increased, as compared with the case where turbo encoding is performed at the data rate of 32 Kbps/10 ms (i.e., each frame consists of 320 bits). However, it is possible to decrease the BER for the same signal-to-noise ratio Eb/No or decrease the Eb/No value for the same BER, thereby increasing the overall system capacity.

In the mobile communication system, not all the users or mobile stations are provided with the same services. Instead, the available data rate is limited according to the user class, the mobile station or the base station. In addition, the available data rate may be limited due to the memory capacity determined according to the class of the respective mobile stations. Accordingly, when the data rate is variable from 32 Kbps to 2048 Kbps according to the service type (or service option) and the permissible time delay also varies from 10 ms to 400 ms, the device according to the present invention can vary the length of the frames input to the turbo encoder according to the class of the user or mobile station the class of the base station service type or the channel condition while satisfying the required error rate of the corresponding service. For example, when the channel conditions is bad, the device according to the present invention can satisfy the error rate required by a corresponding service by increasing the length of the frames input to the turbo encoder and thereby permitting an increase in the time delay rather than increasing the transmission power.

The frame disassemble/assemble information which is the message information being exchanged between the base station and the mobile station, has information about the size of the frames to be encoded/decoded, wherein the frame size may be determined according to user data rate, input frame length, permissible delay, permissible error rate and the channel condition, etc.

The bit counter 50 counts N bits of the input data according to an N-bit frame disassemble/assemble control signal output from the CPU 46, and provides the counted N bits to the programmable interleaver 52 and first and second input buffers 54 and 56. The bit counter 50 also generates a bit count termination signal to the CPU 46 whenever it counts N bits of the input data. Therefore, it can be appreciated that the bit counter 50 disassembles or assembles the input frames into sub or super frames having a specific length, under the control of the CPU 46 which uses the QoS information, such as the service type and the data rate of the input data, stored in the frame disassemble/assemble information storage 48, and provides the sub or super frames to the programmable interleaver 52 and the first and second input buffers 54 and 56.

An interleaving processor 72, a component of the programmable interleaver 52, reads interleaving parameters from an interleaving parameter storage 70 according to an interleaving mode control signal output from the CPU 46 to process the read interleaving parameters, and provides the processing result to an interleaving address mapper 74. Here, the CPU 46 provides the interleaving processor 72 with the following interleaving information.

First, in the case where a turbo interleaver having a single interleaving method is used as the interleaver 52, optimal parameter values are provided as the interleaving information. The optimal parameter values are determined to have the highest performance according to the length of the data information bits sequence to be interleaved. The parameter values can be determined by experimentally obtained value.

Second, in the case where a turbo interleaver having one or more interleaving methods is used as the interleaver 52, optimal parameter values are provided as the interleaving information and are determined to have the highest performance through experiments according to the length of the information bits for interleaving and the variable length of the interleaver in the corresponding interleaving mode. For example, in the case where the required transmission delay time is short and the input data frame of the turbo encoder (i.e., the output data frame of the source data encoder 42) is small in size (or length), a uniform interleaver such as a block interleaver or a cyclic shift interleaver is used for the interleaver 52. Otherwise, in the case where the required transmission delay time is relatively long and the input data frame is large in size, a non-uniform interleaver such as a random interleaver is used for the interleaver 52. From the foregoing description, it could be appreciated that various interleavers can be used according to the size of the data to be interleaved.

The interleaving address mapper 74 receives either sub or super frames of N-bit length disassembled or assembled by the bit counter 50 the interleaving address mapper 74 maps the input bits to the interleaved data buffer address corresponding to the interleaving processing result so as to perform interleaving, and provides the interleaved data to an interleaved input data buffer (ILIB) 78 in the first buffer 54 or an ILIB 90 in the second buffer 56.

The first and second input buffers 54 and 56 each include two input switches, two output switches, an input data save buffer (IDSB) with input and output ports connected to ones of the input and output switches, and the ILIB with input and output ports connected to the other ones of the input and output switches. In the drawing, reference numerals 76 and 88 denote IDSBs, reference numerals 78 and 90 denote ILIBs, reference numerals 80, 84, 92 and 96 denote input switches, and reference numerals 82, 86, 94 and 98 denote output switches. All the switches are controlled by the CPU 46. The switches 80, 82, 84 and 86 in the first input buffer 54 operate as a mirror image in alternation with the switches 92, 94, 96 and 98 in the second input buffer 56. That is, input switches 80 and 84 in the first input buffer 54 are in the ON state and the output switches 82 and 86 are in the OFF state, while the input switches 92 and 96 in the second input buffer 56 are in the OFF state and the output switches 94 and 98 are in the ON state.

Accordingly, when the bit counter 50 counts N bits of the input data under the control of the CPU 46, the data output from the bit counter is first stored in the IDSB 76 in the first buffer 54 through the input switch 80 which is initially in the ON state. At this moment, the counted data bits output from the bit counter 50 are interleaved by the programmable interleaver 52 and then stored in the ILIB 78 in the first input buffer 54 through the switch 84. If the bit counter 50 generates a bit count termination signal for the sub/super frame of N-bit length, the CPU 46 then repeats the above procedure after switching the first input buffer 54 to an output state and the second input buffer 56 to an input state. As a result, the next N bits counted from the bit counter 50 and the interleaved data from the programmable interleaver 52 are stored in the IDSB 88 and the ILIB 90 in the second input buffer 56, respectively.

During this operation, a first RSC (RSC1) 58 and a second RSC (RSC2) 60 receive the N-bit sub/super frame data and the corresponding interleaved data output from the IDSB 76 and ILIB 78 in the first input buffer through the output switches 82 and 86, respectively, and then performs turbo encoding by the N-bit frame unit in the same manner as the turbo encoder of FIG. 1.

Next, when the N-bit frame data is completely stored in the second input buffer 56, the first input buffer 54 is again switched to the input state and the second input buffer 56 to the output state. Therefore, the RSC1 58 and the RSC2 60 turbo encode the data which are alternately output by the N-bit frame unit from the first and second input buffers 54 and 56.

Figure 4:
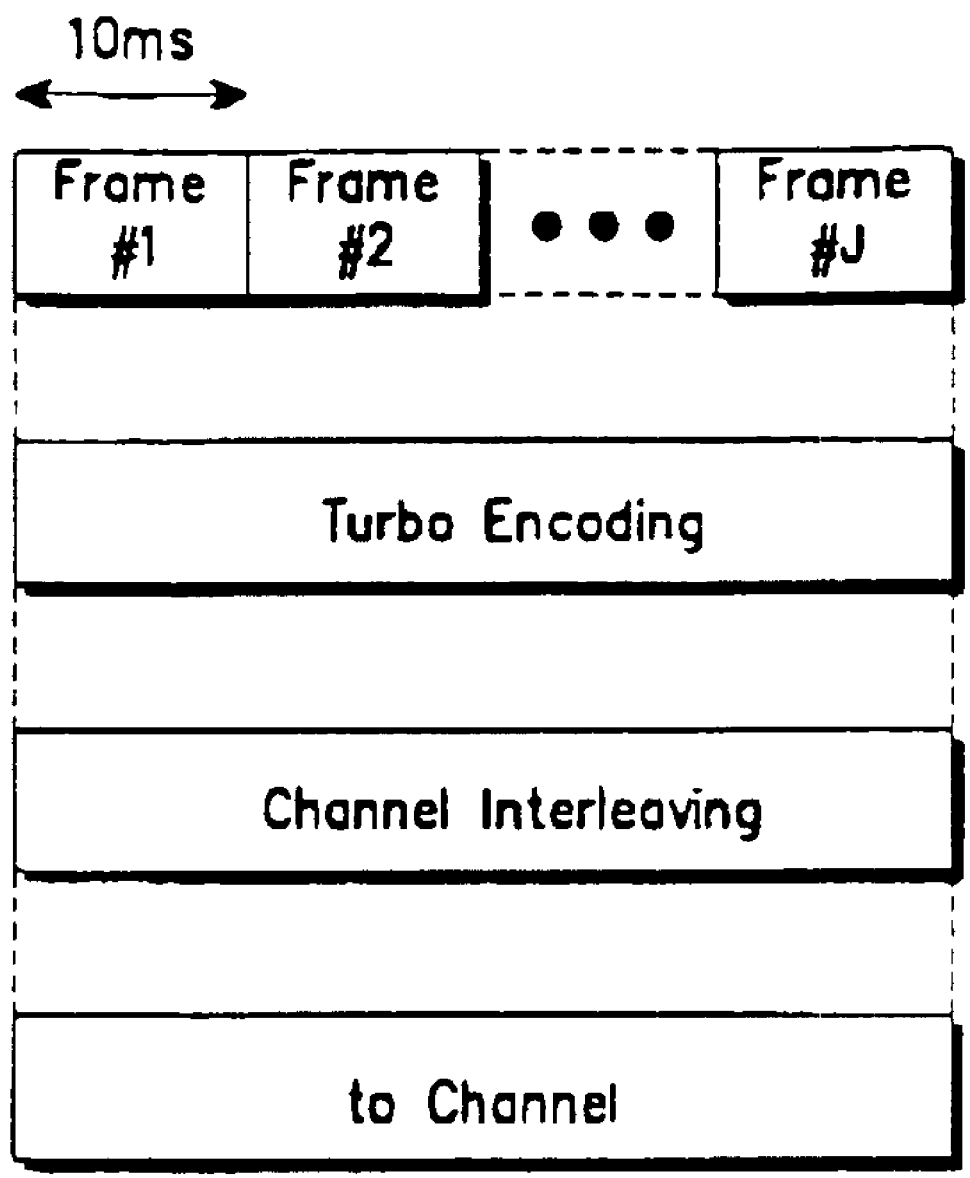
FIG. 4 is a diagram illustrating a method for assembling turbo and encodiong input frames according to an embodiment of the present invention.
Figure 5:
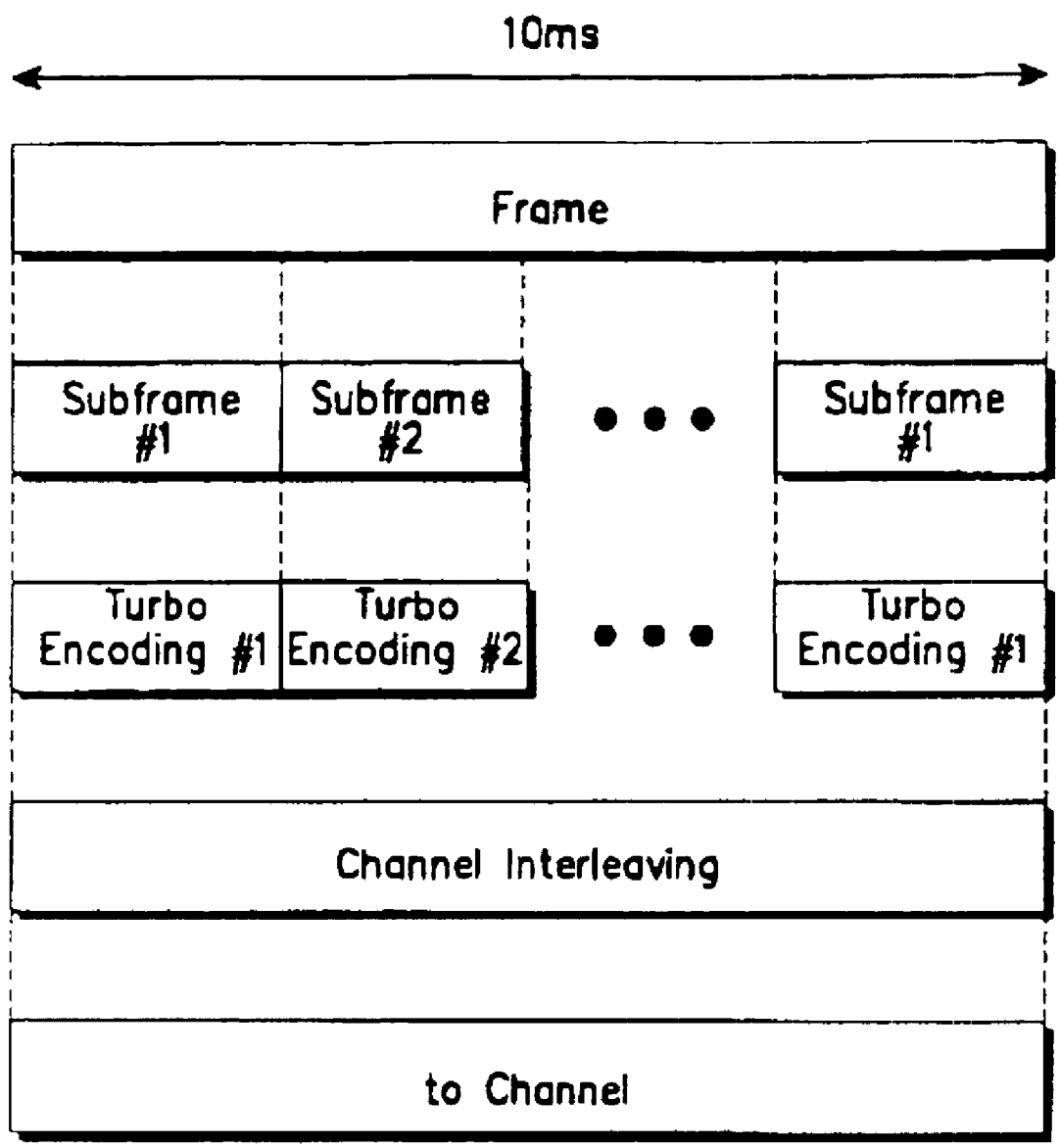
FIG. 5 is a diagram illustrating a method for disassembling an input frame and turbo encoding the disassembled frames according to an embodiment of the present invention.

The turbo encoded bits from the RSC1 58 and the RSC2 60 are multiplexed by a multiplexer 62 and then interleaved by a channel interleaver 64. In the case where the several input frames are assembled into one super frame and the data is turbo encoded by the super frame unit, the channel interleaver 64 performs channel interleaving by the super frame unit as shown in FIG. 4. On the other hand, when one input frame is disassembled into several sub frames and the data is turbo encoded by the sub frame unit, the channel interleaving is performed by the input frame unit as shown in FIG. 5. That is, the channel interleaver 64 performs channel interleaving by assembling the output symbols of the turbo encoder, encoded by the super frame or sub frame unit, as large in size as the input frame. The interleaved data is modulated by a modulator 66 and then transmitted through a transmission channel 68.

Thus, the novel channel transmission device shown in FIG. 3 combines the input data frames into super frames to increase the bit number N when a low BER is required from an analysis of the QoS information such as the user's service type (e.g., voice, character, image and moving picture). Otherwise, when a low decoder complexity is required, the novel channel transmission device segments the input data frame into sub frames to decrease the bit number N per frame. In this manner, the channel transmission device can maximize the efficiency of the turbo encoder.

FIG. 4 is a diagram for explaining the operation of the invention, wherein the frames are assembled at a low or medium data rate and then turbo encoded. For example, a parameter J can be varied from 1 to 8 according to the number of the frames to be assembled. In the turbo encoder, the bit number of an input data frame, which is determined by multiplying the bit number of original frame by the frame number, J, may be limited depending on user data rate and decoder complexity.

FIG. 5 is a diagram for explaining operation of the invention, wherein a frame data provided at a high data rate is segmented and then turbo encoded. A parameter I can be varied from 1 to 4 according to the number of the disassembled sub frames. Likewise, in the turbo encoder, the bit number of an input data frame, which is determined by a value obtained by dividing the bit number of original frame by the number, I, of the disassembled sub frames, may be limited.

Figure 6:
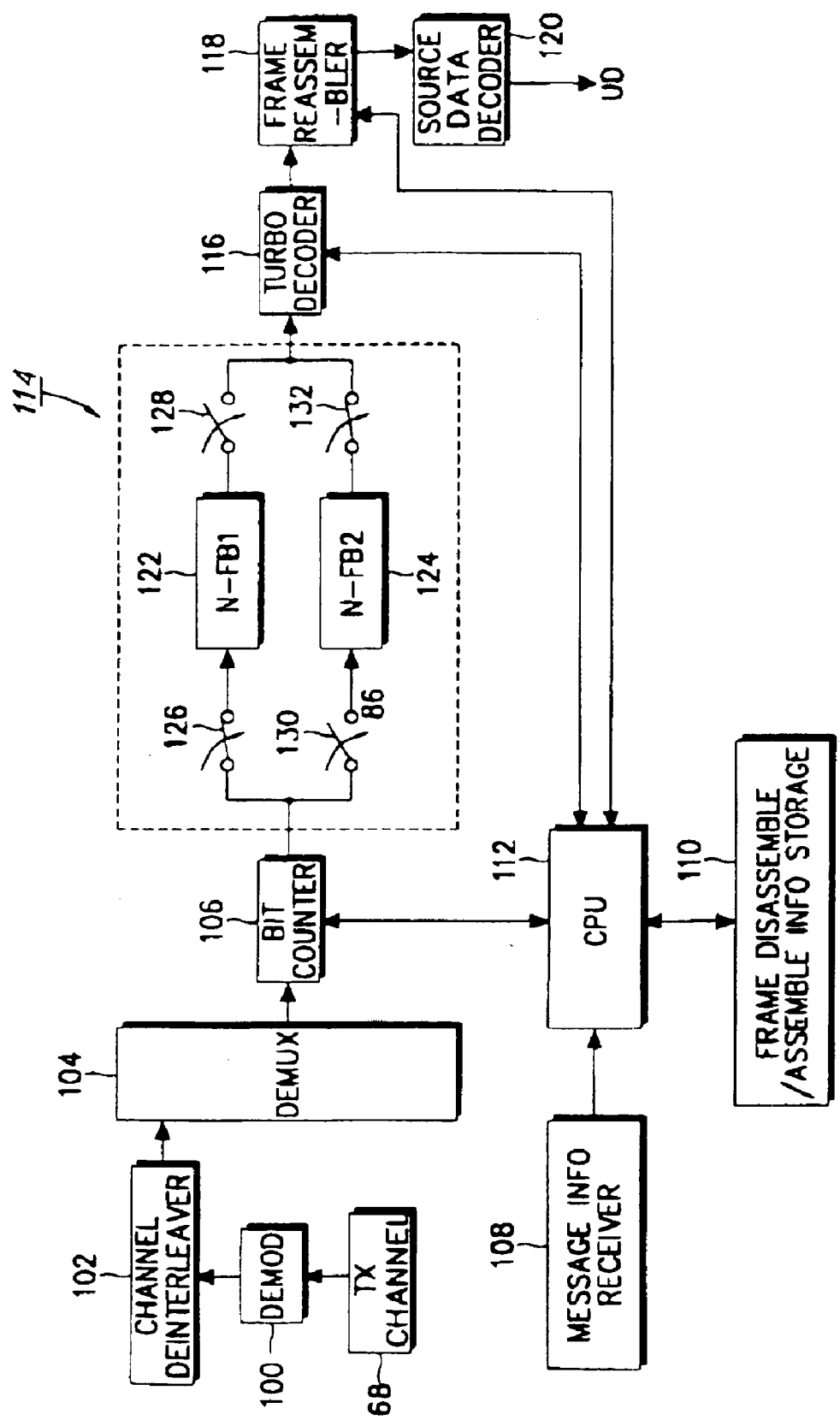
FIG. 6 is a diagram illustrating a block diagram of a channel receiver including a turbo decoder according to an embodiment of the present invention.

The data on the transmission channel transmitted by the turbo channel encoder of FIG. 3 is decoded into the original data by the turbo channel decoder of FIG. 6, which is more fully described from the following description.

FIG. 6 illustrates the turbo channel decoder configuration according to an embodiment of the present invention. The turbo channel decoder of FIG. 6 counts bits of the user data input by the N-bit sub frame unit according to message information to decode the input user data and thereafter, combines the decoded data into frames having the original length, thereby recombining the user data. When the user data consist of by N-bit super frame, the turbo decoder decodes the input user data and thereafter disassemble the decoded data into frames having the original length, thereby recombining the user data.

Referring to FIG. 6, upon receiving a frame of N-bit length through the transmission channel 68, a demodulator 100 demodulates the received frame data and provides the demodulated data to a channel deinterleaver 102. The channel deinterleaver 102 descrambles the demodulated data frame and applies it to a demultiplexer 104, which demultiplexes the multiplexed data symbols and parity symbols and provides the demultiplexed symbols to a bit counter 106. Here, a message information receiver 108 receives message information regarding the service type of the user and the data rate that the message information transmitter 44 of FIG. 3 has transmitted, and provides the received message information to a CPU 112.

The CPU 112 analyzes the message information provided from the message information receiver 108 and reads frame segment/assemble information from a frame segment/assemble information storage 110 according to the analysis. Also, the CPU 112 analyzes the interleaving information included in the message information and provides an interleaving mode signal and a parameter value to an interleaver and a deinterleaver in a turbo decoder 116 according to the analysis, thereby performing turbo interleaving. In addition, when the receiving data is sub frame (actually the received data is a original frame size but the frame is encoded by sub frame unit), the CPU 112 outputs an N-bit frame segment control signal before turbo decoding and a frame recompose control signal after turbo decoding according to the read message information. Here, the information stored in the frame segment/assemble information storage 110 is similar to that stored in the frame segment/assemble information storage 48 of FIG. 3.

The bit counter 106 consecutively provides the data output from the demultiplexer 104 to a frame buffer 114 by the N-bit sub frame unit according to the N-bit frame disassemble control signal. Switches 126 and 132 in the frame buffer 114 are initially in the ON state and the other switches 128 and 130 are initially in the OFF state.

Figure 2:
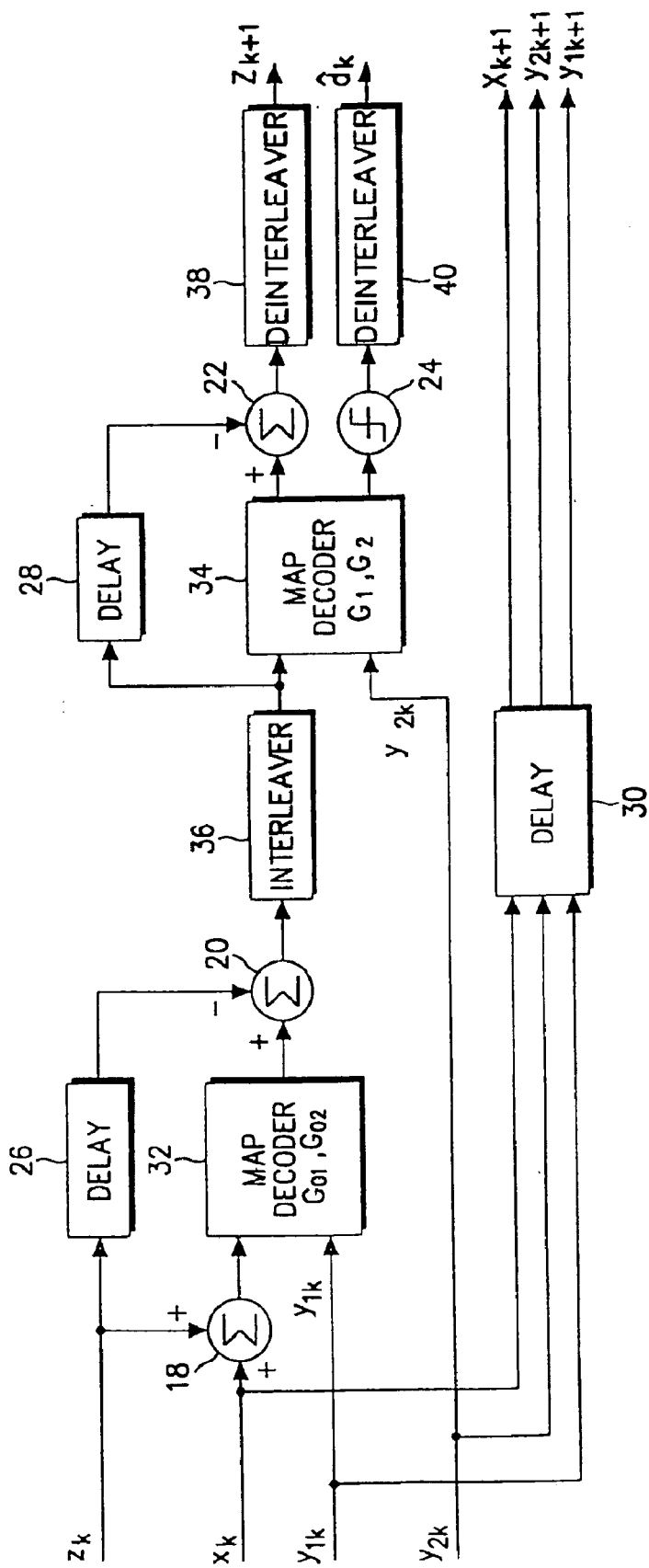
FIG. 2 is a diagram illustrating a block diagram of a conventional turbo decoder.

Therefore, the counted data bits output from the bit counter 106 are initially stored in a first N-frame buffer (N-FB1) 122. Upon completion of storing the N-bit data output from the bit counter 106 in the N-FB1 122, the bit counter 106 generates an N-bit count termination signal. Upon detecting the N-bit count termination signal, the CPU 112 turns off switches 126 and 132 in the frame buffer 114 and turns on the other switches 130 and 128. Then, the N-bit data output from the bit counter 106 is stored in a second N-frame buffer (N-FB2) 124. At this-moment, the received data stored in the N-FB1 122 is decoded by a turbo decoder 116 having the same structure as that of FIG. 2.

Accordingly, under the control of the CPU 112, the N-FB1 122 and the N-FB2 124 in the frame buffer 114 alternately receive and store the data output by the N-bit unit from the bit counter 106, and the stored data is decoded by the turbo decoder 116. When user data decoded by sub frame unit, the decoded data output from the turbo decoder 116 is recomposed or reassembled into the frames of the original length by a frame reassembler 118 which is controlled by the CPU 112, and then output as the user data through a source data decoder 120.

In summary, the turbo decoder 116, broadly described, receives a super frame consisting of multiple frames or multiple sub frames segmented from a frame, and turbo decodes the received frames. The frame reassembler 118, under the control of the CPU 112, recomposes or reassembles, when user data decoded by sub frame unit the output of the turbo decoder 116 into the original frames in response to information about the frame size and number of the frames constituting the sub frames or information about the number of the sub frames segmented from the input frame and the size of the sub frames. The frame reassembler 118, under control of the CPU 112 segments when user data decoded by super frame unit, the output of the turbo decoder 116 into the original frames in response to information about the frame size and number of the frames constituting super frame.

The turbo encoder of the present invention also includes a method in which any one of the bit counter 50 and the buffers 54 and 56 for interleaving, shown in FIG. 3, is not required. In the frame assembling operation, the data bits are sequentially stored in the memory (i.e, buffer 54 or 56) for interleaving the number of the frames to be assembled. Data bits are sequentially output to the RSC1 in the turbo encoder in quantities equivalent to the number of non-interleaved assembled frames. Data bits are output to the RSC2 in quantities equivalent to the number of assembled frames which are interleaved to the addresses of the interleaving address mapper generated by the interleaving processor.

In another exemplary method, in the frame assembling operation, the input data bits are sequentially stored in the memory for interleaving. Data bits are sequentially output to the RSC1 in the turbo decoder in quantities equivalent to the size of the disassembled frame size. Data bits are interleaved to the RSC2 and output in quantities equivalent to the size of the assembled frame size.

Accordingly, the turbo channel encoder of FIG. 3 and the turbo channel decoder of FIG. 6 assemble input data frames into a super frame to encode and decode the input frames by the super frame unit when the input data frames are too short, and disassemble an input frame into multiple sub frames to encode and decode the input frame by the sub frame unit when the input frame is too long, to increase transmission efficiency.

As described above, the embodiment of the present invention disassembles/assembles input frames into sub/super frames of an appropriate length when the input data frame is very long or short, and then encodes and decodes the sub/super frames. In this manner, it is possible to reduce the number of required calculations and memory capacity required in the decoder, while fully securing the performance of the turbo code encoder.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A mobile communication system having a turbo encoder having input data frames of variable size, comprising:
   a processor for determining a number and a size of sub frames which can be generated from the input data frame of variable size, according to a size of the input data frame; and
   a turbo encoder for turbo encoding each of the sub frames separately to output encoded sub frames.

2. The mobile communication system as claimed in claim 1, further comprising a channel interleaver for interleaving an encoded data frame, wherein the encoded data frame is constructed by concatenating the encoded sub frames.

3. The mobile communication system as claimed in claim 1, wherein the processor determines to segment the input data frame when the size of the input data frame is 20480 bits.

4. The mobile communication system as claimed in claim 1, wherein the number and size of the sub frames is determined by a permissible delay.

5. The mobile communication system as claimed in claim 1, wherein the number and size of the sub frames is determined by a permissible error rate.

6. The mobile communication system as claimed in claim 1, wherein the turbo encoder comprises:
   a first constituent encoder for encoding data of the sub frame;
   an interleaver for interleaving the data of the sub frame; and
   a second constituent encoder, operably connected to said interleaver, for encoding the interleaved data of the sub frame.

7. The mobile communication as claimed in claim 6, said interleaver includes an interleaving address mapper for interleaving data of said sub frame.

8. The mobile communication system as claimed in claim 6, further comprising a multiplexer for multiplexing the data of the sub frame and respective outputs of the first and second constituent encoders.

9. The mobile communication system as claimed in claim 1, further wherein the number and the size of sub frames is determined by a receiver memory size.

10. The mobile communication system as claimed in claim 1, wherein the size of said sub frames are equal.

11. A channel encoding method for a mobile communication system having a turbo encoder having input data frames of variable size, comprising the steps of:
    determining a number and a size of sub frames that can be generated from the input data frame of variable size when the size of the input data frame is greater than a predetermined value;
    segmenting the input frame into the determined number of sub frames; and
    encoding each of the sub frames separately to output encoded sub frames.

12. The channel encoding method as claimed in claim 11, further comprising the steps of:
    constructing an encoded input data frame by concatenating the output of the turbo encoder for the input data frame; and
    channel interleaving the encoded input data frame.

13. The channel encoding method as claimed in claim 11, wherein the input data frame is segmented when the size of the input data frame is 20480 bits.

14. The mobile communication system as claimed in claim 11, wherein the number and the size of sub frames is determined by a permissible delay.

15. The channel encoding method as claimed in claim 11, wherein the number and the size of sub frames is determined by a permissible error rate.

16. The channel encoding method as claimed in claim 11, wherein the encoding step further comprises the steps of:
    encoding data of the sub frame to encode the input data;
    interleaving the data of the sub frame to generate a interleaved sub frame; and
    encoding data of the interleaved sub frame.

17. The mobile communication system as claimed in claim 11, wherein the number and the size of the sub frames is determined by a receiver memory size.

18. The mobile communication system as claimed in claim 11, wherein the size of said sub frames are equal.

19. A channel encoding method for a mobile communication system having a turbo encoder having input data frames of variable size, comprising the steps of:
    comparing a bit number of the input data frame input into the turbo encoder with a predetermined value;
    deciding to segment the input data frame into sub frames if the bit number is more than the predetermined value; and
    turbo encoding each of the sub frames separately.

20. The channel encoding method as claimed in claim 19, wherein the predetermined value is 20480 bits.

21. A mobile communication system having a turbo encoder having input data frames of variable size, comprising:
    a decoder for turbo decoding a sub frame to output a decoded sub frame, wherein said sub frame is segmented from one original input data frame; and
    a frame recomposer for combining the decoded sub frame into the original input data frame in accordance with message information about more than one sub frames.

22. The mobile communication system as claimed in claim 21, further comprising a processor for determining a number and a size of the more than one sub frames upon receiving the message information about the number and the size of the more than one sub frame, and providing the determined number and size information to the frame recomposer.

23. The mobile communication system as claimed in claim 21, wherein said message information is received during a call setup.

24. A channel decoding method for a mobile communication system having a turbo encoder having input data frames of variable size, comprising the steps of:
- segmenting a received data frame into a number of sub frames according to received message information, each said sub frame is segmented from one original input data frame;
- turbo decoding each of the sub frames separately to output decoded sub frames; and
- combining the decoded sub frames into the original input data frame in response to said message information about the number of the sub frames.

25. A mobile communication system having a turbo encoder having input data frames of variable size, comprising:
- a processor for determining to segment the input data frame to compose a plurality of sub frames when the size of an input data frame is more than a predetermined value;
- a buffer for storing the plurality of sub frames;
- a first constituent encoder for encoding data of the sub frame received from the buffer;
- an interleaver for interleaving the data of the sub frame;
- a second constituent encoder for encoding the interleaved data; and
- a channel interleaver for interleaving an encoded data frame, wherein the encoded data frames is constructed by concatenating the encoded sub frames.

26. The mobile communication system as claimed in claim 25, the predetermined value is 20480 bits.

* * * * *